United States Patent
Singh et al.

(10) Patent No.: US 9,419,032 B2
(45) Date of Patent: Aug. 16, 2016

(54) WAFER LEVEL CAMERA MODULE WITH MOLDED HOUSING AND METHOD OF MANUFACTURING

(75) Inventors: Harpuneet Singh, Dublin, CA (US); Dongkai Shangguan, San Jose, CA (US); Samuel Waising Tam, Daly City, CA (US)

(73) Assignee: NANCHANG O-FILM OPTOELECTRONICS TECHNOLOGY LTD, Nanchang (CN)

( * ) Notice: Subject to any disclaimer, the term of this patent is extended or adjusted under 35 U.S.C. 154(b) by 232 days.

(21) Appl. No.: 12/583,193

(22) Filed: Aug. 14, 2009

(65) Prior Publication Data

US 2011/0037886 A1 Feb. 17, 2011

(51) Int. Cl.
*H01L 27/146* (2006.01)
*G02B 13/00* (2006.01)
(Continued)

(52) U.S. Cl.
CPC ...... *H01L 27/14618* (2013.01); *G02B 13/0085* (2013.01); *H01L 27/14625* (2013.01); *H01L 27/14685* (2013.01); *H04N 5/2257* (2013.01);
(Continued)

(58) Field of Classification Search
CPC ............................ H04N 5/2254; H04M 1/0264
USPC .......................................................... 348/340
See application file for complete search history.

(56) References Cited

U.S. PATENT DOCUMENTS

| 4,345,021 A | 8/1982 | Ogawa et al. |
| 4,681,416 A | 7/1987 | Raschke |
| 4,687,314 A | 8/1987 | Raschke |

(Continued)

FOREIGN PATENT DOCUMENTS

| CN | 1517735 A | 8/2004 |
| CN | 1517736 A | 8/2004 |

(Continued)

OTHER PUBLICATIONS

Merriam-Webster Online Dictionary; Definition of verd mold; p. 4; http://www.merriam-webster.com/dictionary/mold.*
(Continued)

*Primary Examiner* — Roberto Velez
*Assistant Examiner* — Cynthia Segura
(74) *Attorney, Agent, or Firm* — Polsinelli PC

(57) ABSTRACT

A disclosed method of manufacturing a camera module includes providing an optical assembly, providing an integrated circuit image capture device (ICD), fixing the optical assembly directly to the ICD, then forming a housing directly over the optical assembly. The method further includes forming the housing over the ICD and the optical assembly via transfer molding. The method further includes forming solder balls on the rear surface of the ICD so as to enable the camera module to be reflow soldered to a host device. In an alternative embodiment of the present invention, the method includes providing a second ICD, providing a second optical assembly, providing a housing substrate, fixing the first optical assembly over the first ICD, fixing the second optical assembly over the second ICD, and forming the housing substrate over both the first and second optical assemblies. The alternative method further includes separating the housing substrate in to a first portion formed over the first optical assembly and second portion formed over the second optical assembly, providing a second housing substrate, and forming the second housing substrate over the first and second portions.

25 Claims, 9 Drawing Sheets

(51) Int. Cl.
*H04N 5/225* (2006.01)
*H05K 3/34* (2006.01)

(52) U.S. Cl.
CPC ....... *H01L 2924/0002* (2013.01); *H05K 3/3436* (2013.01); *Y10T 29/49826* (2015.01)

(56) References Cited

U.S. PATENT DOCUMENTS

| | | | |
|---|---|---|---|
| 4,690,512 A | 9/1987 | Forsyth | |
| 4,727,389 A | 2/1988 | Raschke | |
| 4,987,435 A | 1/1991 | Touma et al. | |
| 5,149,181 A | 9/1992 | Bedford | |
| 5,529,936 A | 6/1996 | Rostoker | |
| 5,815,742 A | 9/1998 | Hamada et al. | |
| 5,866,942 A * | 2/1999 | Suzuki et al. | 257/698 |
| 5,912,872 A | 6/1999 | Feldman et al. | |
| 6,096,155 A | 8/2000 | Harden et al. | |
| 6,235,141 B1 | 5/2001 | Feldman et al. | |
| 6,249,311 B1 | 6/2001 | Rouse et al. | |
| 6,255,640 B1 | 7/2001 | Endo et al. | |
| 6,256,155 B1 | 7/2001 | Nagaoka | |
| 6,285,064 B1 | 9/2001 | Foster | |
| 6,295,156 B1 | 9/2001 | Feldman et al. | |
| 6,324,010 B1 | 11/2001 | Bowen et al. | |
| 6,330,400 B1 | 12/2001 | Bittner et al. | |
| 6,374,004 B1 | 4/2002 | Han et al. | |
| 6,381,072 B1 | 4/2002 | Burger | |
| 6,406,583 B1 | 6/2002 | Harden et al. | |
| 6,407,381 B1 | 6/2002 | Glenn et al. | |
| 6,426,829 B1 | 7/2002 | Feldman et al. | |
| 6,451,150 B2 | 9/2002 | Feldman et al. | |
| 6,483,627 B2 | 11/2002 | Feldman et al. | |
| 6,528,857 B1 | 3/2003 | Glenn et al. | |
| 6,566,745 B1 | 5/2003 | Beyne et al. | |
| 6,582,079 B2 | 6/2003 | Levine | |
| 6,649,008 B2 | 11/2003 | Feldman et al. | |
| 6,669,803 B1 | 12/2003 | Kathman et al. | |
| 6,670,205 B1 | 12/2003 | Byun | |
| 6,683,298 B1 | 1/2004 | Chang et al. | |
| 6,686,588 B1 | 2/2004 | Webster et al. | |
| 6,777,311 B2 | 8/2004 | Han et al. | |
| 6,836,382 B2 | 12/2004 | Ning | |
| 6,841,883 B1 | 1/2005 | Farnworth et al. | |
| 6,853,005 B2 | 2/2005 | Ikeda | |
| 6,869,233 B2 | 3/2005 | Westerweck et al. | |
| 6,873,024 B1 | 3/2005 | Prabhu et al. | |
| 6,885,107 B2 | 4/2005 | Kinsman | |
| 6,903,883 B2 | 6/2005 | Amanai | |
| 6,954,311 B2 | 10/2005 | Amanai | |
| 6,995,462 B2 | 2/2006 | Bolken et al. | |
| 7,019,374 B2 | 3/2006 | Kayanuma et al. | |
| 7,043,284 B2 | 5/2006 | Tornaghi | |
| 7,046,296 B2 | 5/2006 | Shinomiya | |
| 7,078,799 B2 | 7/2006 | Vittu | |
| 7,083,999 B2 | 8/2006 | Hashimoto | |
| 7,091,599 B2 | 8/2006 | Fujimori | |
| 7,129,146 B2 | 10/2006 | Hsu | |
| 7,167,376 B2 | 1/2007 | Miyashita et al. | |
| 7,169,645 B2 | 1/2007 | Bolken et al. | |
| 7,199,438 B2 * | 4/2007 | Appelt et al. | 257/433 |
| 7,205,095 B1 | 4/2007 | Prabhu et al. | |
| 7,242,433 B2 | 7/2007 | Tanaka et al. | |
| 7,245,319 B1 | 7/2007 | Enomoto | |
| 7,265,916 B2 | 9/2007 | Kimura | |
| 7,280,149 B2 | 10/2007 | Weintroub et al. | |
| 7,301,577 B2 | 11/2007 | Sakamoto | |
| 7,378,724 B2 | 5/2008 | Yu et al. | |
| 7,388,613 B2 | 6/2008 | Raschke | |
| 7,391,458 B2 | 6/2008 | Sakamoto | |
| 7,414,661 B2 | 8/2008 | Hartlove et al. | |
| 7,433,555 B2 | 10/2008 | Lee et al. | |
| 7,457,050 B2 | 11/2008 | Betensky | |
| 7,469,100 B2 | 12/2008 | Toor et al. | |
| 7,477,461 B2 | 1/2009 | Bareau et al. | |
| 7,494,292 B2 | 2/2009 | Kong et al. | |
| 7,531,773 B2 | 5/2009 | Westerweck et al. | |
| 7,593,057 B2 * | 9/2009 | Yee et al. | 348/373 |
| 7,622,786 B2 | 11/2009 | England | |
| 7,688,382 B2 | 3/2010 | Nishida et al. | |
| 7,796,187 B2 | 9/2010 | Shangguan et al. | |
| 7,901,973 B2 | 3/2011 | Yamamoto | |
| 7,939,901 B2 * | 5/2011 | Minamio et al. | 257/433 |
| 8,223,248 B2 * | 7/2012 | Lee | H01L 27/14618 257/432 |
| 8,368,786 B2 * | 2/2013 | Fukuta | G02B 13/0025 348/294 |
| 8,456,560 B2 | 6/2013 | Singh | |
| 2001/0055073 A1 | 12/2001 | Shinomiya | |
| 2002/0094198 A1 | 7/2002 | Uchiyama | |
| 2002/0131782 A1 | 9/2002 | Yamaguchi et al. | |
| 2003/0016452 A1 | 1/2003 | Sayag | |
| 2003/0218251 A1 | 11/2003 | Seo | |
| 2004/0042779 A1 | 3/2004 | Maeda et al. | |
| 2004/0056970 A1 | 3/2004 | Westerweck et al. | |
| 2004/0077121 A1 | 4/2004 | Maeda et al. | |
| 2004/0089859 A1 * | 5/2004 | Shirakawa et al. | 257/1 |
| 2004/0207036 A1 | 10/2004 | Ikeda | |
| 2004/0212719 A1 | 10/2004 | Ikeda | |
| 2004/0245649 A1 | 12/2004 | Imaoka | |
| 2005/0030647 A1 | 2/2005 | Amanai | |
| 2005/0046010 A1 | 3/2005 | Vittu | |
| 2005/0073602 A1 | 4/2005 | Kamoda et al. | |
| 2005/0077458 A1 * | 4/2005 | Ma et al. | 250/239 |
| 2005/0110107 A1 | 5/2005 | Yamamoto et al. | |
| 2005/0146800 A1 | 7/2005 | Yamada et al. | |
| 2005/0179805 A1 | 8/2005 | Avron et al. | |
| 2005/0185088 A1 | 8/2005 | Kale et al. | |
| 2005/0237418 A1 * | 10/2005 | Sakamoto | 348/340 |
| 2005/0285016 A1 | 12/2005 | Kong et al. | |
| 2005/0285973 A1 | 12/2005 | Singh et al. | |
| 2006/0001759 A1 | 1/2006 | Raschke | |
| 2006/0006511 A1 * | 1/2006 | Roh et al. | 257/680 |
| 2006/0019428 A1 | 1/2006 | Kurosawa et al. | |
| 2006/0023108 A1 | 2/2006 | Watanabe et al. | |
| 2006/0028573 A1 | 2/2006 | Seo et al. | |
| 2006/0044450 A1 | 3/2006 | Wolterink et al. | |
| 2006/0054782 A1 | 3/2006 | Olsen et al. | |
| 2006/0054787 A1 * | 3/2006 | Olsen et al. | 250/208.1 |
| 2006/0066945 A1 | 3/2006 | Yeo et al. | |
| 2006/0066959 A1 | 3/2006 | Koga et al. | |
| 2006/0109367 A1 | 5/2006 | Hirooka | |
| 2006/0127085 A1 | 6/2006 | Matsuki et al. | |
| 2006/0132644 A1 | 6/2006 | Shangguan et al. | |
| 2006/0139776 A1 | 6/2006 | Mori | |
| 2006/0181748 A1 | 8/2006 | Makii et al. | |
| 2006/0204243 A1 | 9/2006 | Tsai | |
| 2006/0215053 A1 | 9/2006 | Kinoshita | |
| 2006/0219885 A1 | 10/2006 | Kinoshita et al. | |
| 2006/0249737 A1 | 11/2006 | Fujimori | |
| 2006/0251414 A1 | 11/2006 | Nishizawa | |
| 2007/0019102 A1 | 1/2007 | Nakajo et al. | |
| 2007/0032169 A1 | 2/2007 | Neely et al. | |
| 2007/0037485 A1 | 2/2007 | Neely | |
| 2007/0052050 A1 | 3/2007 | Dierickx | |
| 2007/0053672 A1 | 3/2007 | Westerweck et al. | |
| 2007/0053685 A1 | 3/2007 | Shibata et al. | |
| 2007/0058964 A1 | 3/2007 | Shangguan et al. | |
| 2007/0077051 A1 | 4/2007 | Toor et al. | |
| 2007/0077805 A1 | 4/2007 | Nomura et al. | |
| 2007/0091198 A1 * | 4/2007 | Watanabe et al. | 348/340 |
| 2007/0126898 A1 | 6/2007 | Feldman et al. | |
| 2007/0126914 A1 | 6/2007 | Komatsu et al. | |
| 2007/0164409 A1 | 7/2007 | Holland | |
| 2007/0166029 A1 * | 7/2007 | Lee et al. | 396/529 |
| 2007/0211163 A1 * | 9/2007 | Huang | H01L 27/14618 348/340 |
| 2007/0212061 A1 | 9/2007 | Woo | |
| 2007/0236591 A1 | 10/2007 | Tam et al. | |
| 2007/0258006 A1 | 11/2007 | Olsen et al. | |
| 2007/0275505 A1 | 11/2007 | Wolterink et al. | |
| 2007/0278394 A1 | 12/2007 | Shangguan et al. | |
| 2007/0279518 A1 | 12/2007 | Apel et al. | |
| 2007/0295893 A1 * | 12/2007 | Olsen | H01L 27/14634 |

(56) References Cited

U.S. PATENT DOCUMENTS

| | | | |
|---|---|---|---|
| 2008/0040069 A1 | 2/2008 | Grziwa et al. | 250/226 |
| 2008/0058010 A1 | 3/2008 | Lee | |
| 2008/0068728 A1 | 3/2008 | Westerweck et al. | |
| 2008/0074528 A1 | 3/2008 | Westerweck et al. | |
| 2008/0118241 A1 | 5/2008 | TeKolste et al. | |
| 2008/0136956 A1 | 6/2008 | Morris et al. | |
| 2008/0143864 A1* | 6/2008 | Yamaguchi et al. | 348/340 |
| 2008/0152339 A1 | 6/2008 | Westerweck et al. | |
| 2008/0158362 A1 | 7/2008 | Butterworth | |
| 2008/0159734 A1 | 7/2008 | Westerweck et al. | |
| 2008/0170141 A1 | 7/2008 | Tam et al. | |
| 2008/0180566 A1* | 7/2008 | Singh | 348/373 |
| 2008/0225415 A1 | 9/2008 | Bogue et al. | |
| 2008/0252770 A1 | 10/2008 | Raschke | |
| 2008/0252775 A1* | 10/2008 | Ryu | H04N 5/2253 348/374 |
| 2008/0252795 A1 | 10/2008 | Bone et al. | |
| 2008/0278617 A1* | 11/2008 | Tanida et al. | 348/340 |
| 2008/0279544 A1 | 11/2008 | Westerweck | |
| 2008/0279545 A1 | 11/2008 | Westerweck | |
| 2008/0296714 A1* | 12/2008 | Yuan | H01L 27/14618 257/432 |
| 2009/0015706 A1 | 1/2009 | Singh | |
| 2009/0021624 A1 | 1/2009 | Westerweck et al. | |
| 2009/0046376 A1 | 2/2009 | Westerweck et al. | |
| 2009/0103193 A1 | 4/2009 | Berube | |
| 2009/0110385 A1 | 4/2009 | Toor et al. | |
| 2009/0115891 A1* | 5/2009 | Ryu et al. | 348/374 |
| 2009/0152658 A1* | 6/2009 | Bolken et al. | 257/432 |
| 2009/0160998 A1* | 6/2009 | Fukamachi | G02B 7/021 348/340 |
| 2009/0206431 A1* | 8/2009 | Bolken | G02B 7/02 257/432 |
| 2009/0213262 A1* | 8/2009 | Singh et al. | 348/340 |
| 2009/0243051 A1* | 10/2009 | Vanam et al. | 257/659 |
| 2009/0267170 A1 | 10/2009 | Chien et al. | |
| 2010/0053423 A1* | 3/2010 | Singh | 348/374 |
| 2010/0226633 A1* | 9/2010 | Shiung | G03B 17/00 396/80 |
| 2010/0259657 A1* | 10/2010 | Lee | H01L 27/14618 348/294 |
| 2011/0032409 A1* | 2/2011 | Rossi | G02B 5/005 348/340 |
| 2011/0096213 A1* | 4/2011 | Hasegawa | 348/294 |
| 2011/0260035 A1* | 10/2011 | Seger | H04N 5/2254 250/208.1 |
| 2012/0249822 A1* | 10/2012 | Yoshida | H01L 27/14618 348/222.1 |
| 2013/0285185 A1* | 10/2013 | Park | H01L 27/14618 257/434 |
| 2014/0098288 A1 | 4/2014 | Singh | |

FOREIGN PATENT DOCUMENTS

| | | | |
|---|---|---|---|
| CN | 1666130 A | 9/2005 | |
| CN | 1682377 A | 10/2005 | |
| CN | 1719590 A | 1/2006 | |
| EP | 1 387 397 A2 | 2/2004 | |
| EP | 1 443 754 A2 | 4/2004 | |
| EP | 1 441 509 A2 | 7/2004 | |
| JP | S61-129616 A | 6/1986 | |
| JP | H02-079685 A | 3/1990 | |
| JP | H04-023469 A | 1/1992 | |
| JP | H07-131701 A | 5/1995 | |
| JP | H07 (1995)-181389 A | 7/1995 | |
| JP | 08-064556 | 3/1996 | |
| JP | H08-288484 A | 11/1996 | |
| JP | 09-139484 A | 5/1997 | |
| JP | H09-329818 A | 12/1997 | |
| JP | H10-327344 A | 12/1998 | |
| JP | 2000-155270 A | 6/2000 | |
| JP | 2000-323692 A | 11/2000 | |
| JP | 2001-292354 A | 10/2001 | |
| JP | 2001-292365 A | 10/2001 | |
| JP | 2001-333332 A | 11/2001 | |
| JP | 2002-010123 A | 1/2002 | |
| JP | 2002-016194 A | 1/2002 | |
| JP | 2002-246638 A | 8/2002 | |
| JP | 2002-280535 A | 9/2002 | |
| JP | 2003-031782 A | 1/2003 | |
| JP | 2003-110891 A | 4/2003 | |
| JP | 2003-197656 A | 7/2003 | |
| JP | 2003-234465 A | 8/2003 | |
| JP | 2004-016410 A | 1/2004 | |
| JP | 2004-029554 A | 1/2004 | |
| JP | 2004-040287 A | 2/2004 | |
| JP | 2004-053648 A | 2/2004 | |
| JP | 2004-061623 A | 2/2004 | |
| JP | 2004-080774 A | 3/2004 | |
| JP | 2004-088713 A | 3/2004 | |
| JP | 2004-200965 A | 7/2004 | |
| JP | 2004-207461 A | 7/2004 | |
| JP | 2004-282778 A | 7/2004 | |
| JP | 2004-226872 A | 8/2004 | |
| JP | 2004-304605 A | 10/2004 | |
| JP | 2004-328474 A | 11/2004 | |
| JP | 2005-056999 A | 3/2005 | |
| JP | 2005-116628 A | 4/2005 | |
| JP | 2005-148109 A | 6/2005 | |
| JP | 2005-173265 A | 6/2005 | |
| JP | 2005-216970 A | 8/2005 | |
| JP | 2005-266129 A | 9/2005 | |
| JP | 2005-295050 A | 10/2005 | |
| JP | 2005-317745 A | 11/2005 | |
| JP | 2005-338749 A | 12/2005 | |
| JP | 2005-340539 A | 12/2005 | |
| JP | 2005-539276 A | 12/2005 | |
| JP | 2006-054506 A | 2/2006 | |
| JP | 2006-100587 A | 4/2006 | |
| JP | 2006-180487 A | 7/2006 | |
| JP | 200624887 A * | 9/2006 | C03B 11/10 |
| JP | 2006-276897 A | 10/2006 | |
| JP | 2006-294720 A | 10/2006 | |
| JP | 2007-017974 A | 1/2007 | |
| JP | 2007-129164 A | 5/2007 | |
| JP | 2007-292845 A | 11/2007 | |
| JP | 4027962 B1 | 12/2007 | |
| KR | 2005 0000722 A | 1/2005 | |
| WO | WO 02/065208 A1 | 8/2002 | |
| WO | WO2004/027880 A2 | 4/2004 | |
| WO | WO 2004/027880 A2 | 4/2004 | |
| WO | WO 2005/069602 A2 | 7/2005 | |
| WO | WO 2006/025698 A1 | 3/2006 | |
| WO | WO 2006/035963 A1 | 4/2006 | |
| WO | WO 2006/025496 A1 | 9/2006 | |
| WO | WO 2006/093377 A1 | 9/2006 | |
| WO | WO 2007/016413 A2 | 2/2007 | |
| WO | WO 2007/016414 A2 | 2/2007 | |
| WO | WO 2008/021167 A2 | 2/2007 | |
| WO | WO 2008/011003 A2 | 1/2008 | |
| WO | WO 2008/070125 A2 | 6/2008 | |
| WO | WO 2008/079403 A2 | 7/2008 | |
| WO | WO 2008/085489 A1 | 7/2008 | |
| WO | WO 2008/133943 A1 | 11/2008 | |

OTHER PUBLICATIONS

U.S. Appl. No. 60/859,519, coversheet, specification, claims, and drawings filed Nov. 17, 2006.
U.S. Appl. No. 11/698,776, Restriction Requirement dated Jun. 10, 2009.
U.S. Appl. No. 11/698,776, Office Action dated Nov. 13, 2009.
U.S. Appl. No. 11/698,776, Office Action dated Jul. 16, 2010.
U.S. Appl. No. 11/698,776, Office Action dated Jan. 28, 2011.
U.S. Appl. No. 11/698,776, Interview Summary dated May 6, 2011.
PCT Application No. PCT/US2008/001083, International Search Report and Written Opinion dated Jul. 18, 2008.
PCT Application No. PCT/US2008/001083, International Preliminary Report on Patentability dated Aug. 6, 2009.
CN Application No. 200880009978.7, Office Action dated Apr. 8, 2011 (English translation).

(56) References Cited

OTHER PUBLICATIONS

U.S. Appl. No. 11/402,196, Office Action dated Nov. 15, 2007.
U.S. Appl. No. 11/402,196, Restriction Requirement dated Aug. 15, 2008.
U.S. Appl. No. 11/402,196, Office Action dated Mar. 5, 2009.
U.S. Appl. No. 11/402,196, Office Action dated Nov. 13, 2009.
U.S. Appl. No. 11/402,196, Office Action dated Jul. 9, 2010.
U.S. Appl. No. 11/402,196, Office Action dated Mar. 30, 2011.
PCT Application No. PCT/US2007/008668, International Search Report and Written Opinion dated Nov. 4, 2008.
PCT Application No. PCT/US2007/008668, International Preliminary Report on Patentability dated Dec. 31, 2008.
EP Application No. 07755070.5, European Search Report dated Sep. 9, 2010.
EP Application No. 07755070.5, Office Action dated Sep. 28, 2010.
*High Precision Optical Assembly Starts Here*, Opto-Alignment Technology, Inc., Jan. 1996.
Shin et al.; *Fabrication of Phone-Camera Module Using Wafer-Scale UV Embossing Process*; Sensors, Cameras, and Systems for Scientific/Industrial Applications VII, edited by Morley M. Burke; Proc. of SPIE-IS&T Electronic Imaging; SPIE vol. 6068, 60680Q, © 2006 SPIE-IS&T.
PCT Application No. PCT/US2010/002251, International Search Report and Written Opinion dated Oct. 4, 2010.
PCT Application No. PCT/US2010/002251, International Preliminary Report on Patentability dated Feb. 23, 2012.
JP Application No. 2012-524704, Office Action dated Apr. 4, 2013 (English translation).
KR Application No. 10-2012-7006585, Office Action dated Mar. 4, 2013 (English translation).
U.S. Appl. No. 12/150,119, Office Action dated Dec. 16, 2010.
U.S. Appl. No. 12/150,119, Office Action dated Sep. 28, 2011.
U.S. Appl. No. 12/150,119, Office Action dated Apr. 30, 2012.
PCT Application No. PCT/US2008/005298, International Search Report and Written Opinion dated Sep. 2, 2008.
PCT Application No. PCT/US2008/005298, International Preliminary Report on Patentability dated Nov. 5, 2009.
CN Application No. 200880021357.0, Office Action dated Mar. 9, 2011 (English translation).
CN Application No. 200880021357.0, Office Action dated Mar. 30, 2012 (English translation).
CN Application No. 200880021357.0, Office Action dated Dec. 21, 2012 (English translation).
JP Application No. 2010-506259, Office Action dated Oct. 17 2011 (English translation).
JP Application No. 2010-506259, Office Action dated Jun. 11, 2012 (English translation).
U.S. Appl. No. 12/150,118, Office Action dated Dec. 20, 2010.
U.S. Appl. No. 12/150,118, Office Action dated Oct. 11, 2011.
U.S. Appl. No. 12/150,118, Office Action dated May 24, 2012.
U.S. Appl. No. 12/150,118, Notice of Allowance dated Dec. 14, 2012.
PCT Application No. PCT/US2008/005289, International Search Report and Written Opinion dated Sep. 2, 2009.
PCT Application No. PCT/US2008/005289, International Preliminary Report on Patentability dated Nov. 5, 2009.
CN Application No. 2008-80021337.3, Office Action dated Feb. 28, 2011 (English translation).
JP Application No. 2010-506257, Office Action dated Oct. 17, 2011 (English translation).
JP Application No. 2010-506257, Office Action dated Sep. 6, 2012 (English translation).
U.S. Appl. No. 12/368,454, Office Action dated Mar. 31, 2011.
U.S. Appl. No. 12/368,454, Office Action dated Sep. 14, 2011.
U.S. Appl. No. 12/368,454, Advisory Action dated Nov. 23, 2011.
U.S. Appl. No. 12/368,454, Office Action dated Jan. 20, 2012.
U.S. Appl. No. 12/368,454, Office Action dated Nov. 2, 2012.
U.S. Appl. No. 12/368,454, Office Action dated Apr. 26, 2013.
PCT Application No. PCT/US09/034528, International Search Report dated Apr. 20, 2009.
PCT Application No. PCT/US09/034528, International Preliminary Report on Patentability dated Feb. 24, 2010.
CN Application No. 200980111373.3, Office Action dated May 17, 2012 (English translation).
CN Application No. 200980111373.3, Office Action dated Feb. 17, 2013 (English translation).
U.S. Appl. No. 11/698,776, Office Action dated Aug. 8, 2011.
U.S. Appl. No. 11/698,776, Office Action dated Dec. 30, 2011.
U.S. Appl. No. 11/698,776, Advisory Action dated Mar. 6, 2012.
U.S. Appl. No. 11/698,776, Office Action dated May 23, 2012.
U.S. Appl. No. 11/698,776, Notice of Allowance dated Oct. 11, 2012.
U.S. Appl. No. 11/698,776, Notice of Allowance dated Feb. 16, 2013.
CN Application No. 200880009978.7, Office Action dated Apr. 24, 2012 (English translation).
CN Application No. 200880009978.7, Office Action dated Aug. 20, 2012 (English translation).
CN Application No. 200880009978.7, Office Action dated Feb. 16, 2013 (English translation).
JP Application No. 2012-524704, Office Action dated Jul. 2, 2012 (English translation).
U.S. Appl. No. 12/150,119, Office Action dated Apr. 16, 2013.
U.S. Appl. No. 12/150,118, Corrected Notice of Allowance after IDS dated Nov. 4, 2013.
CA Patent Application Serial No. 2,685,080, Office Action dated Nov. 20, 2013.
CA Patent Application Serial No. 2,685,083, Office Action dated Nov. 20, 2013.
JP Application No. 2012-524704, Office Action dated Sep. 18, 2013 (English trans).
U.S. Appl. No. 13/909,808, Office Action dated Sep. 11, 2013.
U.S. Appl. No. 12/150,119, Office Action dated Oct. 18, 2013.
CN Patent Application Serial No. 200880021357.0, Office Action dated Jul. 3, 2013 (English translation).
JP Patent Application Serial No. 2010-506259, Office Action dated Oct. 7, 2013 (English translation).
JP Patent Application Serial No. 2012-226416, Office Action dated Sep. 11, 2013 (English translation).
U.S. Appl. No. 12/150,118, Supplemental Notice of Allowance dated Jun. 13, 2013.
U.S. Appl. No. 12/150,118, Corrected Notice of Allowance dated Jul. 24, 2013.
U.S. Appl. No. 12/150,118, Corrected Notice of Allowance after IDS dated Sep. 26, 2013.
JP Patent Application Serial No. 2010-506257, OA dated Oct. 16, 2013 (English Translation).
CN Patent Application Serial No. 200980111373.3, Office Action dated Aug. 21, 2013 (English Translation).
JP Application No. 2010-547748, Office Action dated Jun. 25, 2013 (English Translation).
U.S. Appl. No. 11/600,282, Restriction Requirement dated Oct. 9, 2009.
U.S. Appl. No. 11/600,282, Office Action dated Dec. 24, 2009.
U.S. Appl. No. 11/600,282, Office Action dated Jul. 23, 2010.
U.S. Appl. No. 11/600,282, Office Action dated Feb. 4, 2011.
U.S. Appl. No. 11/600,282, Office Action dated Jul. 6, 2011.
U.S. Appl. No. 11/600,282, Office Action dated Nov. 28, 2011.
U.S. Appl. No. 11/600,282, Abandonment Notice dated Jun. 8, 2012.
PCT Application No. PCT/US2007/023961, International Search Report & Written Opinion dated May 26, 2008.
PCT Application No. PCT/US2007/023961, International Preliminary Report on Patentability dated May 19, 2009.
CN Application No. 200780049903.7, Office Action dated Sep. 21, 2010 (English translation).
CN Application No. 200780049903.7, Office Action dated Jul. 13, 2011 (English translation).
EP Application No. 07840058.7-1524, Office Action dated Oct. 10, 2011.
JP Application No. 2009-0537200, Office Action dated Sep. 6, 2011 (English translation).
JP Application No. 2009-0537200, Office Action dated May 15, 2012 (English translation).
JP Application No. 2009-0537200, Decision of Refusal dated Feb. 12, 2013 (English translation).

(56) References Cited

OTHER PUBLICATIONS

JP Application No. 2009-0537200, Appeal Interrrogatory dated Sep. 10, 2013. (Non-English document).
TW Application No. 2007 0143796, Office Action dated Jul. 28, 2011 (Non-English document).
TW Application No. 2007 0143796, Office Action dated Jan. 17, 2013 (Non-English document).
TW Application No. 2007 0143796, Decision of Refusal dated May 15, 2013 (English translation).
CA Application No. 2,676,550, Office Action dated Oct. 14, 2014.
U.S. Appl. No. 14/102,106, Office Action dated Oct. 22, 2014.
U.S. Appl. No. 12/150,119, Office Action dated Nov. 4, 2014.
Definition of "Attach"; http://www.merriam-webster.com/dictionary/attach; accessed Jun. 20, 2014.
Definition of "Attach"; http://dictionary.reference.com/browse/attach?s=t; accessed Jun. 20, 2014.
Definition of "Bearing"; http://dictionary.reference.com/browse/bearing?s=t; accessed Jun. 20, 2014.
"Die (integrated circuit)—Wikipedia, the free encyclopedia"; http://en.wikipedia.org/wiki/Die_(intergrated_circuit); accessed Oct. 14, 2014.
*Microchip Fabrication, 5$^{th}$ edition*; Van Zant, Peter; McGraw-Hill Companies, Inc.; New York; Copyright 2004; p. 616.
"Aperture—Wikipedia, the free encyclopedia"; http://en.wikipedia.org/wiki/Aperture; accessed Oct. 16, 2014.
CN Application No. 201080046149.3, Office Action dated May 5, 2014 (English translation).
CA Application No. 2,676,550, Office Action dated Jan. 31, 2014.
U.S. Appl. No. 13/909,808, Notice of Allowance dated Jan. 9, 2014.
U.S. Appl. No. 12/150,119, Office Action dated May 7, 2014.
CN Patent Application Serial No. 200880021357.0, Office Action dated Apr. 11, 2014 (English translation).
JP Patent Application Serial No. 2013-043381, Office Action dated Jan. 22, 2014 (English translation).
U.S. Appl. No. 12/368,454 Office Action dated Feb. 7, 2014.
U.S. Appl. No. 12/368,454 Office Action dated Jun. 18, 2014.
JP Patent Application Serial No. 2010-547748, Pre-Appeal Examination Report dated Sep. 9, 2014 (English Summary).

\* cited by examiner

WAFER LEVEL CAMERA MODULE WITH MOLDED HOUSING AND METHOD OF MANUFACTURING

BACKGROUND OF THE INVENTION

1. Field of the Invention

This invention relates generally to electronic devices, and more particularly to digital camera modules. Even more particularly, this invention relates to a design for a simplified wafer level camera module that can be reflow soldered to a hosting device.

2. Description of the Background Art

Digital camera modules are currently being incorporated into a variety of host devices. Such host devices include cellular telephones, personal data assistants (PDAs), computers, etc. Therefore, consumer demand for digital camera modules in host devices continues to grow.

Host device manufacturers prefer digital camera modules to be small, so that they can be incorporated into the host device without increasing the overall size of the host device. Further, host device manufacturers prefer camera modules that minimally affect host device design. In meeting these requirements the host device manufacturers prefer camera modules that capture images of the highest possible quality. Of course, it is an ongoing goal for camera module manufacturers to design camera modules that meet these requirements at minimal manufacturing cost.

A conventional digital camera module generally includes a lens assembly, a housing, a printed circuit board (PCB), and an integrated image capture device (ICD). Typically, the components are formed separately and later assembled to create the digital camera module. That is, the ICD is attached to the PCB, and then the housing is attached to the PCB so that the ICD is surrounded by the bottom of the housing. Then, the lens assembly is mounted to the opposite end of the housing to focus incident light onto an image capture surface of the ICD. Typically, the lens assembly includes a sloped surface (e.g., threads, cam, ramps, etc.) that engage a complementary sloped surface formed on the housing such that proper focusing can be achieved by rotating the lens assembly within the housing. After the lens assembly is properly displaced with respect to the image capture surface, the lens assembly is fixed (e.g., via adhesive, thermal weld, etc.) with respect to the housing. The ICD is electrically coupled to the PCB, which includes a plurality of electrical contacts for the ICD to communicate image data to the host device for processing, display, and storage.

In manufacturing these camera modules, many problems are encountered by the camera module manufacturers. As an example, bare ICD dies are extremely vulnerable to contamination when exposed to contaminants such as dust and/or other particulate debris. Further, ICDs are extremely vulnerable when exposed to materials (e.g., adhesives) and processes (e.g., housing attachment, molding, lens attachment, etc.) used in the assembly of the camera modules. Contamination typically results in the discarding of the defective image capture devices which can be extremely expensive, especially when yield losses are high. To minimize contamination, the camera modules are typically assembled in class 100 clean rooms. Although the image capture devices of assembled camera modules are protected from contaminants outside of the camera module, they are still vulnerable to internal contaminants. Such internal contaminants are usually the result of trapped dust, adhesives, and/or particulates formed by frictional wear within the camera module. Frictional wear typically occurs during assembly processes such as focusing. In particular, particles are formed when the sloped surface of the lens assembly rubs against the sloped surface of the housing. Contamination of an image sensor after the camera is assembled can be especially expensive because the entire camera module may have to be discarded.

Another challenge faced by camera module manufacturers is that the components of camera modules are extremely small and, therefore, require extremely delicate, and therefore expensive, processes for fabrication, assembly, and alignment. Indeed, the alignment process becomes increasingly more difficult as the number of required camera module components is increased. This is because the strict position tolerances between camera module components accumulate proportionally with the number of components coupling the image capture surface to the lenses. Ideally, the lenses should all be coaxially perpendicular to the center of the planar image capture surface. However, this is typically only achieved within a predetermined overall tolerance defined by the sum of: the tolerance of the ICD with respect to the PCB, the tolerance of the PCB with respect to the housing, the tolerance of the housing with respect to the focus/zoom device, and the tolerances of the lenses with respect to the focus/zoom device.

As yet another example problem, camera modules typically cannot be reflow soldered to host devices without damaging the camera module. Reflow soldering is a very well developed and efficient electronic manufacturing process. Therefore, it would be desirable to be able to use a reflow solder process to attach camera modules to host devices. However, known devices cannot withstand reflow solder attachment.

What is needed, therefore, is a camera module that is less vulnerable to contamination of the image capture surface. What is also needed is a camera module that can be assembled with a more forgiving tolerance between the lenses and the image capture surface. What is also needed is a camera module that requires fewer components and fewer manufacturing steps. What is also needed is a camera module that can withstand a reflow soldering process.

SUMMARY

The present invention overcomes the problems associated with the prior art by providing a wafer level camera module capable of withstanding a solder reflow process. The invention facilitates the mounting of the camera modules to printed circuit boards of host devices using a conventional reflow solder process.

An example camera module includes an integrated circuit image capture device, and optical assembly and a housing. The image capture device includes a set of electrical contacts and an image sensor array. The contacts facilitate an electrical connection between the camera module and a camera module hosting device. For example, the camera module is mountable directly to a circuit board of a camera hosting device using solder balls and a reflow soldering process.

The optical assembly is mounted directly on the image capture device, and the housing is formed directly on the optical stack. The housing is formed, for example, via molding directly over the optical assembly and the image capture device. The optical assembly includes a lens mounted over the image sensor array. Optionally, the optical assemble includes a transparent substrate mounted over said image sensor array and a lens stack mounted over the transparent substrate. In another embodiment, the optical assembly is a lens stack that is mounted directly on the integrated circuit image capture device over the sensor array. In either case, the housing is formed directly over the lens stack via molding.

Methods for manufacturing a camera module are also disclosed. An example method includes providing an integrated circuit image capture device, providing an optical assembly, mounting the optical assembly directly to the integrated circuit image capture device, and forming a housing over the optical assembly after the optical assembly is mounted to the image capture device. The step of providing an integrated circuit image capture device includes providing an integrated circuit image capture device including a set of contacts operable to facilitate the reflow soldering of the camera module to a circuit board of a camera module hosting device. The method further includes forming solder balls on the contacts.

The step of forming a housing over the optical assembly includes molding the housing over the optical assembly and over the integrated circuit image capture device.

Optionally, the step of mounting the optical assembly over the integrated circuit image capture device includes mounting a transparent substrate over the sensor array of the integrated circuit image capture device. In a particular example, mounting the transparent substrate over sensor array includes adhering a rigid transparent substrate over the sensor array. The transparent substrate can be adhered directly on the integrated circuit image capture device.

As another option, the step of mounting the transparent substrate over the integrated circuit image capture device includes mounting a lens directly over the sensor array. In this case, the step of mounting the optical assembly over the integrated circuit image capture device includes providing a lens assembly and mounting the lens assembly on the transparent substrate. the step of forming a housing over the optical assembly includes molding a housing directly over the lens assembly and the transparent substrate. In addition, the step of mounting the optical assembly further includes mounting the optical assembly in a focused position before the step of forming the housing on said optical assembly.

Another example method for manufacturing a camera module is disclosed. The method includes providing an integrated circuit image capture device, forming an optical assembly directly on said integrated circuit image capture device, and forming a housing directly over said optical assembly. The step of forming the optical assembly includes forming a pre-focused optical assembly (e.g., an optical stack) directly on the integrated circuit image capture device before the step of forming said housing. The step of providing the image capture device includes forming a plurality of solder balls on the image capture device.

An example method for simultaneously manufacturing a plurality of camera modules is also disclosed. The method includes providing a first image capture device, providing a first optical assembly, providing a second image capture device, providing a second optical assembly, mounting the first optical assembly on the first image capture device, mounting the second optical assembly on the second image capture device, forming a housing substrate over the first optical assembly and the second optical assembly after the first optical assembly is mounted to the first image capture device and the second optical assembly is mounted to the second image capture device, and separating the first housing substrate into a first portion and a second portion after the first housing substrate is formed over the first optical assembly and the second optical assembly. The first portion of the first housing substrate forms a housing over the first optical assembly, and the second portion of the first housing substrate forms a housing over the second optical assembly. Optionally, the method further includes forming a second housing substrate over the first portion of the first housing substrate, the first image capture device, the second portion of the first housing substrate, and the second image capture device. In addition, the method further includes forming a first set of solder balls on the first image capture device and forming a second set of solder balls on the second image capture device. The solder balls can be advantageously formed on the image capture devices after the second housing substrate is formed over the first portion of the first housing substrate, the first image capture device, the second portion of the first housing substrate, and the second image capture device. The example method further includes separating the second housing substrate into a first portion and a second portion after the first set of solder balls are formed on the first image capture device and the second set of solder balls are formed on the second image capture device. The first portion of the second housing substrate is formed over the first portion of the first housing substrate, and the second portion of the second housing substrate is formed over the second portion of the first housing substrate. Alternatively, the step of forming a first set of solder balls on the first image capture device and forming a second set of solder balls on the second image capture device can be performed before the step of separating the first housing substrate.

In a disclosed method, the step of providing the first image capture device and the step of providing the second image capture device include providing a unitary integrated circuit substrate. The first image capture device and the second image capture device are formed on the unitary integrated circuit substrate. For example, the first and second image capture devices are discrete integrated circuits in a unitary silicon wafer. The method further includes separating the first image capture device from the second image capture device after the first housing substrate is formed over the first optical assembly and the second optical assembly. The step of separating the first housing substrate includes separating the first image capture device from the second image capture device.

Optionally, the method further includes molding a second housing substrate into a single body formed over the first portion of the first housing substrate, the first image capture device, the second portion of the first housing substrate, and the second image capture device. The method further includes forming a first set of solder balls on the first image capture device and forming a second set of solder balls on the second image capture device. The solder balls are formed after the second housing substrate is formed over the first portion of the first housing substrate, the first image capture device, the second portion of the first housing substrate, and the second image capture device. The method further includes separating the second housing substrate into a first portion and a second portion after the first set of solder balls is formed on the first image capture device and the second set of solder balls is formed on the second image capture device. The first portion of said second housing substrate is formed over the first portion of the first housing substrate, and the second portion of the second housing substrate is formed over the second portion of the first housing substrate.

In general, the manufacturing method can be applied to a wafer including a great plurality of image capture devices formed therein. In such a case, the steps of providing the first image capture device and the second image capture device include providing an integrated circuit substrate having a plurality of discrete image capture devices formed thereon. The steps of providing the first optical assembly and the second optical assembly include providing a plurality of pre-focused optical stack assemblies. The steps of mounting the first optical assembly to the first image capture device and mounting the second optical assembly to the second image capture device include mounting each of the plurality of pre-focused optical stack assemblies to a respective one of the plurality of image capture devices. In addition, the step of forming the housing substrate over the first optical assembly and the second optical assembly includes forming the housing substrate over the plurality of focused optical assemblies after the step of mounting the plurality of optical assemblies to the plurality of image capture devices, and the step of separating the first housing substrate includes separating the first housing substrate into a plurality of respective discrete housing portions, each formed over a respective one of the plurality of pre-focused optical stack assemblies. Optionally, the method further includes providing a second housing substrate material and forming a second housing substrate over the plurality of housing portions and the plurality of said image capture devices.

The method further includes forming a set of solder balls on each of the plurality of image capture devices. The second housing substrate is separated into a plurality of discrete camera modules, after the step of forming a set of solder balls on each of the image capture devices.

A camera module host device is also disclosed. The host device includes a printed circuit board and a camera module electrically connected to the printed circuit board. The camera module includes an image capture device, an optical assembly, and a housing. The optical assembly is fixed directly to said image capture device, and the housing is formed directly on the optical assembly. The camera module is mounted to the printed circuit board using pick and place technology and then reflow soldered to the printed circuit board.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a simplified wafer level camera module that can withstand reflow soldering conditions. In the following description, numerous specific details are set forth (e.g., number of lenses, type of epoxy, etc.) in order to provide a thorough understanding of the invention. Those skilled in the art will recognize, however, that the invention may be practiced apart from these specific details. In other instances, details of well known electronic assembly practices and equipment have been omitted, so as not to unnecessarily obscure the present invention.

Figure 1:
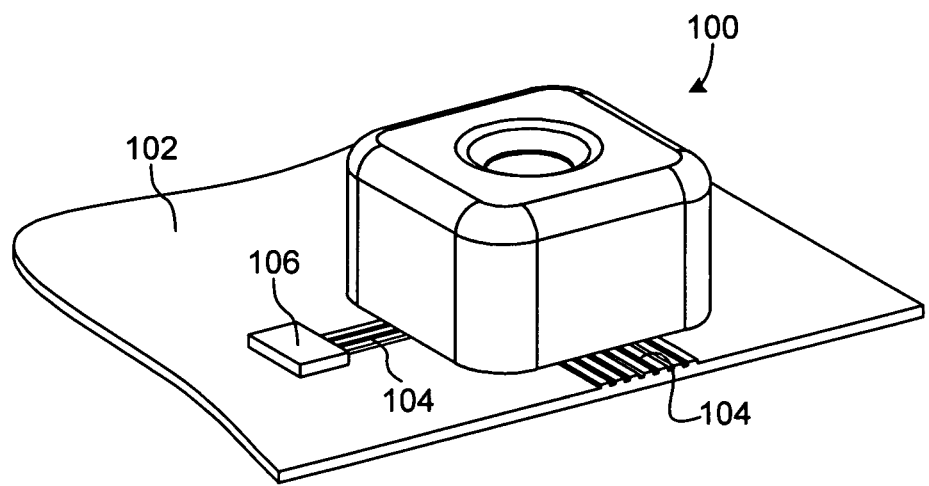
FIG. 1 is a perspective view of a camera module mounted on a printed circuit board of a host device.

FIG. 1 is a perspective view of a camera module 100 according to one embodiment of the present invention. Camera module 100 is shown mounted on a portion of a printed circuit board (PCB) 102 that represents a main PCB of a camera hosting device (e.g., cell phone, PDA, etc.). Camera module 100 communicates electrically with other components of the hosting device via a plurality of conductive traces 104. Device 106 represents an electronic component (e.g., passive component) that may be mounted directly on PCB 102. Those skilled in the art will recognize that the particular design of PCB 102 will depend on the particular application, and is not particularly relevant to the present invention. Therefore, PCB 102, traces 104, and device 106 are representational in character only.

Figure 2:
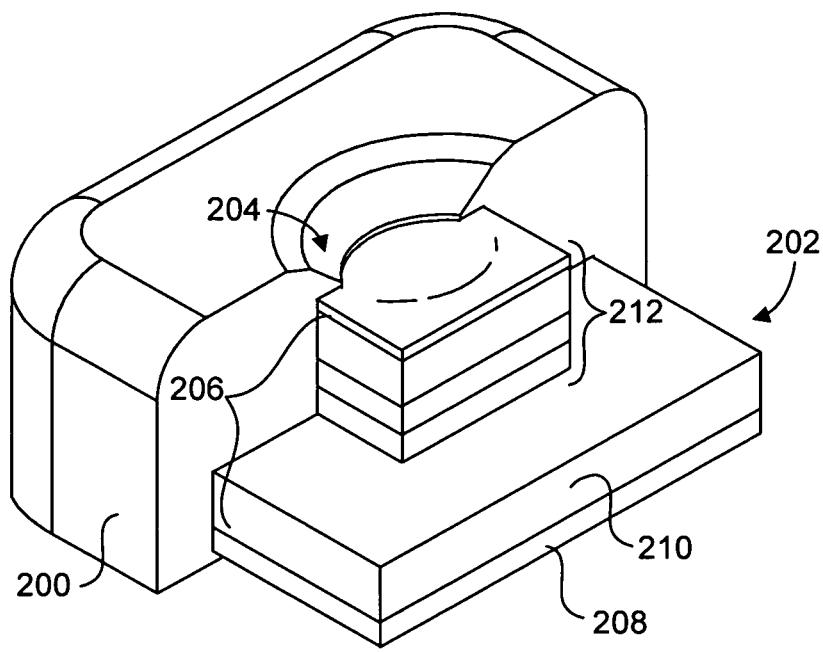
FIG. 2 is a partially sectioned, perspective view of the camera module of FIG. 1.

FIG. 2 is a partially sectioned perspective view of camera module 100. In this particular embodiment, camera module 100 includes a housing 200 formed directly over a wafer level package (WLP) 202. In particular, housing 200 is transfer molded directly over WLP 202, thus yielding camera module 100. Housing 200 is formed from a rigid opaque material (e.g., moldable plastic) that provides structural support to camera module 100 while preventing stray light from passing therethrough. Housing 200 is formed to include an optical aperture 204 to expose an image capture surface of WLP 202 to light.

WLP 202 includes an optical assembly 206 mounted directly on an image capture device (ICD) 208. Optical assembly 206 includes a transparent substrate 210 and a lens stack 212 mounted over ICD 208. Transparent substrate 210 is fixed to ICD 208 by some suitable means such as an optical grade epoxy. Likewise, lens stack 212 is fixed to transparent substrate 210 by some suitable means such as an optical grade epoxy disposed therebetween. Optical assembly 206 will be further discussed with reference to FIG. 3.

Figure 3:
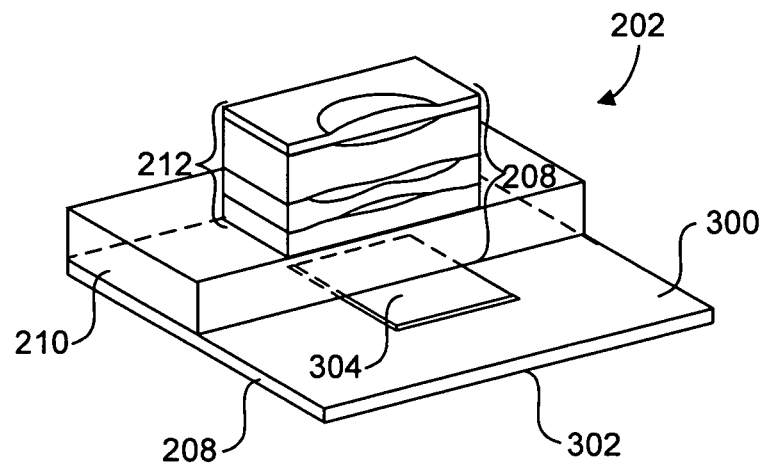
FIG. 3 is a partially sectioned, perspective view of a wafer level package of the camera module of FIG. 1.

FIG. 3 is a partially sectioned perspective view of WLP 202, which is formed by mounting optical assembly 206 directly over ICD 208. ICD 208 includes a top surface 300 and a bottom surface 302. Top surface 300 includes a sensor array 304 operative to convert optical images into electronic signals. Top surface 300 also provides a base to receive optical assembly 206. Bottom surface 302 includes a plurality of electrical contacts 400 (shown in FIG. 4) to facilitate electronic communication between camera module 100 and PCB 102.

Transparent substrate 210 is mounted (e.g., with an optical adhesive) on top surface 300 to protect sensor array 304 from contamination during subsequent manufacturing steps. As an alternative, transparent substrate 210 can be omitted and lens stack 212 can be mounted directly over image sensor array 304. As another alternative, WLP 202 could be a cavity package, wherein transparent substrate 210 would be slightly elevated off of ICD 208 so as to form an air gap therebetween.

After transparent substrate 210 is fixed to ICD 208, lens stack 212 is fixed to the opposite surface of transparent substrate 210. Lens stack 212 can be formed via wafer level processing technologies (e.g., plasma etching, replication, etc.) known to those skilled in the art.

It is important to recognize that no focus mechanism is required and, therefore, none is provided. The reason for this is that the wafer level assembly of optical assembly 206 and the direct attachment of optical assembly 206 to ICD 208 are very precise. In addition, the tolerance stack up (accumulation) suffered by prior art devices is effectively minimized.

Figure 4:
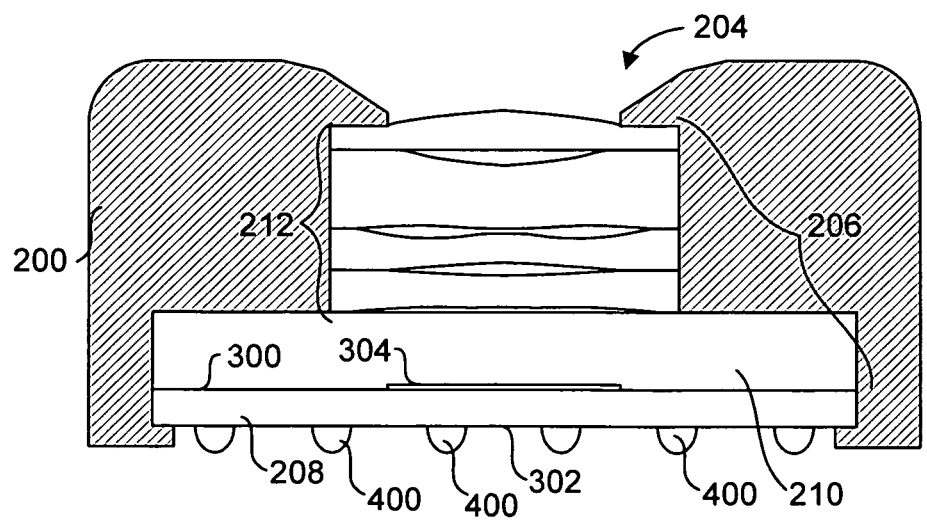
FIG. 4 is a cross-sectional side view of the camera module of FIG. 1.

FIG. 4 is a cross-sectional side view of camera module 100. As shown in this particular embodiment, bottom surface 302 of ICD 208 includes a plurality of electrical contacts 400 which facilitate mounting and the exchange of data between camera module 100 and a host device. In this particular embodiment, contacts 400 are solder balls, which enable camera module to be connected to a host PCB via conventional surface mount technology (e.g., pick and place, reflow, etc.). Also, in this example embodiment, housing 200 wraps around the edges and contacts the bottom surface 302 of ICD 208. It is important to note that camera module 100 can be reflow soldered directly on to the PCB of a hosting device.

Figure 5:
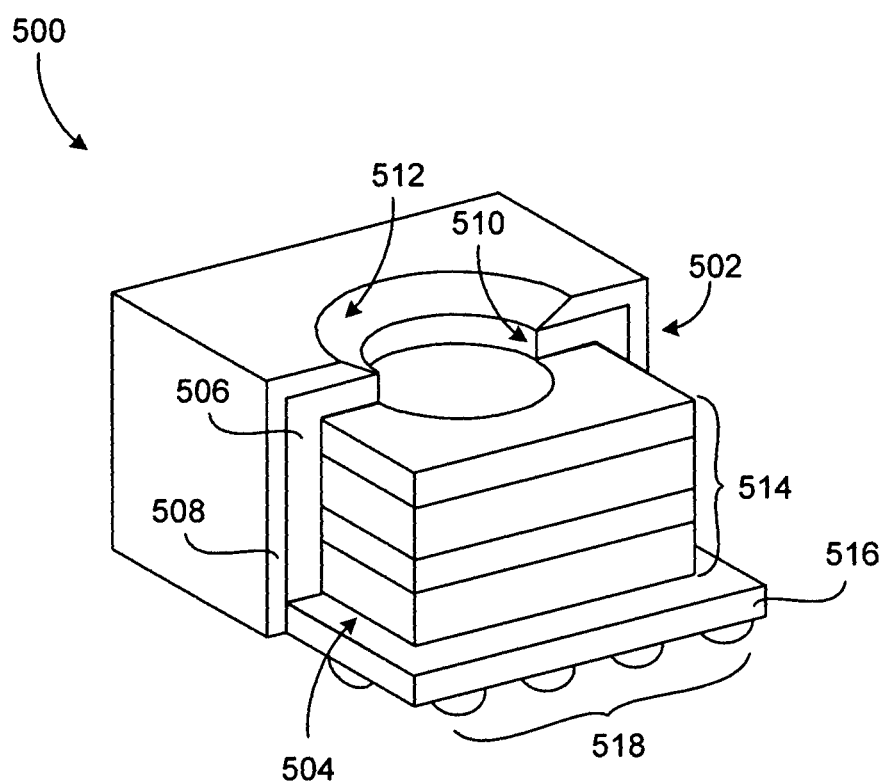
FIG. 5 is a partially sectioned view of an alternative camera module.

FIG. 5 is a partially sectioned perspective view of an alternative camera module 500. In this particular embodiment, camera module 500 includes a housing 502 formed over a wafer level package (WLP) 504. Housing 502 includes an inner layer 506 and an outer layer 508 formed during separate manufacturing processes that will be further discussed with reference to subsequent figures. Inner layer 506 is a rigid opaque material (e.g., moldable plastic) transfer molded directly over WLP 504 so as to provide structural support to WLP during manufacturing processes. Similarly, outer layer 508 is a rigid opaque material transfer molded directly over inner layer 506 and around the sides of WLP 504 to provide structural support to camera module 500 while preventing stray light from passing therethrough. During the molding of inner layer 506 and outer layer 508, two optical apertures 510 and 512, respectively, are left to facilitate the focusing of an image onto a sensor array of ICD 516.

WLP 504 includes a lens stack 514 mounted over image capture device (ICD) 516. In particular, lens stack 514 is fixed directly onto the top surface of ICD 516 via an optical grade epoxy. Likewise, the individual lenses of lens stack 514 are fixed to one another in a focused position via optical grade epoxy. The rear surface of ICD 516 includes set of solder balls 518 formed thereon to facilitate the electrical connection between camera module 500 and a hosting device. Because of the substantial similarity to ICD 208, details of ICD 516 will not be discussed in any greater detail at this point.

Figure 6:
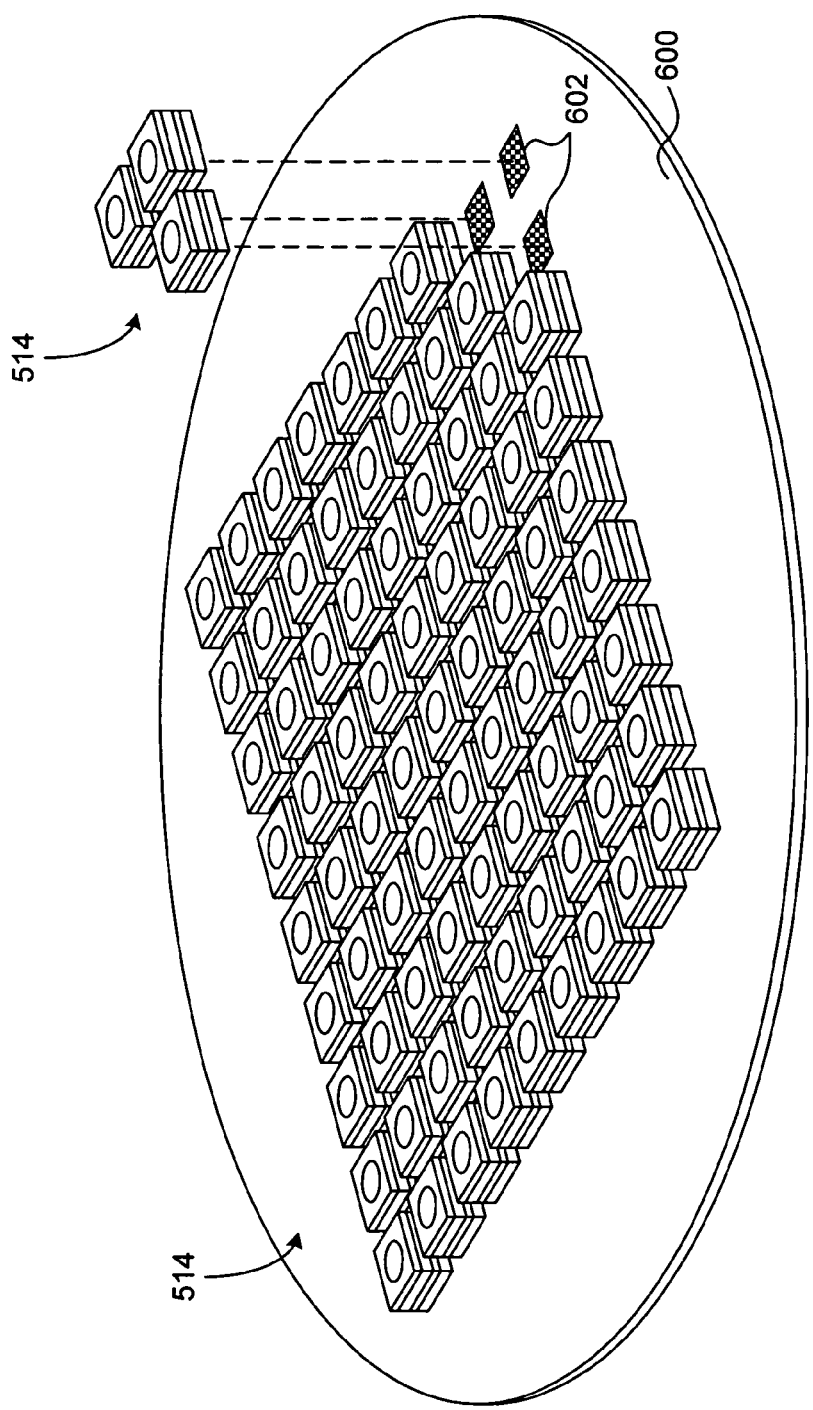
FIG. 6 is a perspective view of an image capture device wafer used to form a plurality of camera modules like the camera module of FIG. 5.

FIG. 6 is a perspective view of an array of individual lens stacks 514 mounted on an integrated circuit ICD wafer 600, so as to form a plurality of individual WLPs 504. ICD wafer 600 includes an array of discrete integrated ICD circuits 602 which, upon separation, yield individual image capture devices 516. In this particular embodiment, each lens stack 514 is formed and then individually mounted over a respective one of ICD circuits 602 in a focused position such that no further focusing processes are needed. Note that three of lens stacks 514 are shown exploded from wafer 600 to show ICD circuits 602 positioned thereunder. It is important to recognize that ICD circuits 602, and therefore lens stacks 514, are spaced apart from one another sufficient to allow the separation wafer 600 into individual WLPs 504, but are positioned as close as possible to conserve area on the silicon wafer.

During the mounting of lens stacks 514, optical grade epoxy is dispensed and evenly distributed across wafer 602. Then, each individual lens stack 514 is precisely placed over a respective one of ICD circuits 602 using, for example, pick-and-place equipment. Once lens stacks 514 are correctly positioned on wafer 600, the epoxy undergoes a curing process (e.g., UV exposure) until stacks 514 are fixed to wafer 602 in preparation for subsequent manufacturing processes.

Figure 7:
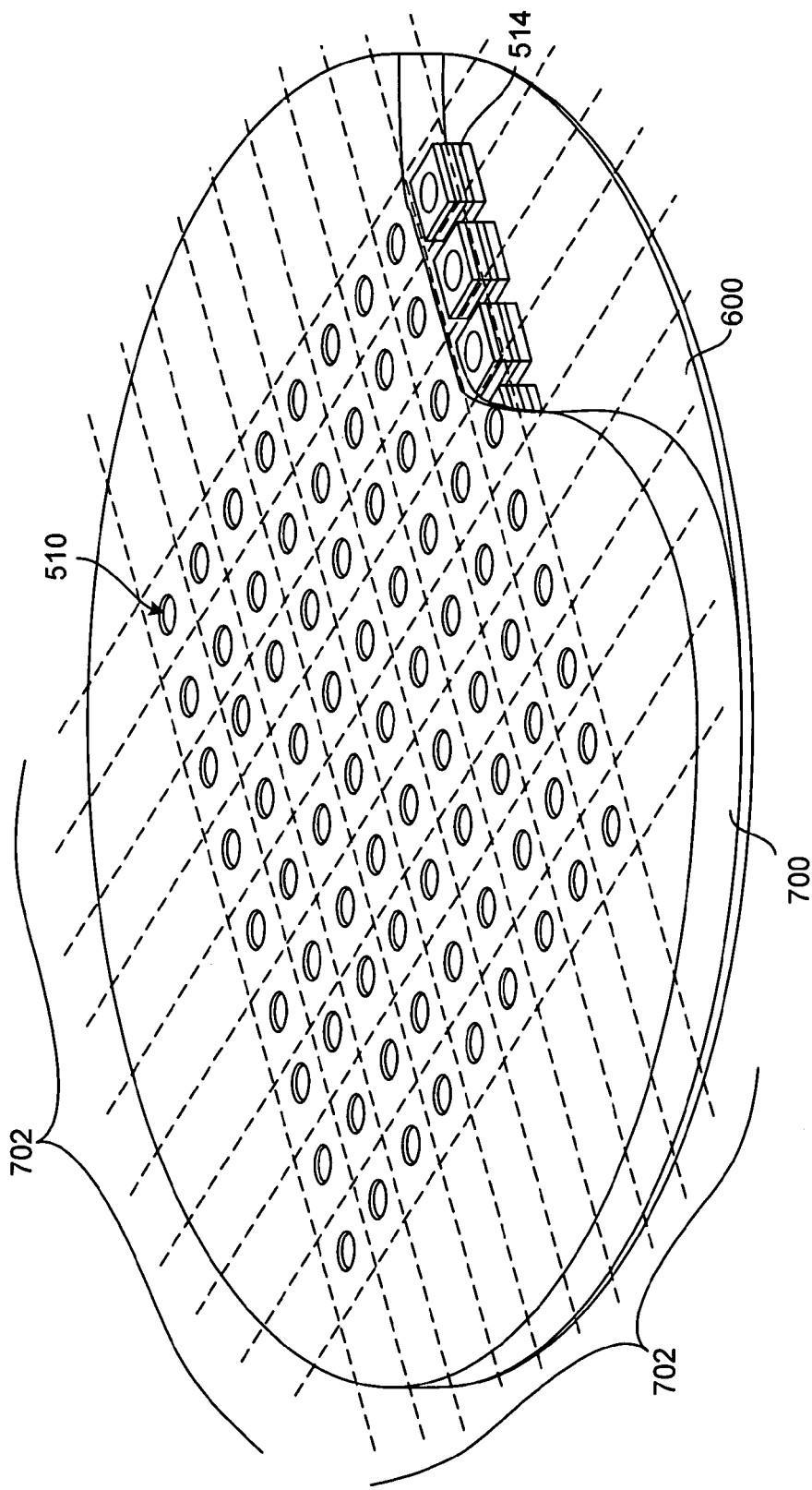
FIG. 7 is a perspective view of a housing substrate formed over the image capture device wafer of FIG. 6.

FIG. 7 shows a partially sectioned, perspective view of a housing substrate 700 formed over lens stacks 514 and wafer 600, which forms inner layer 506. In this particular embodiment, housing substrate 700 is an opaque material (e.g., moldable plastic, thermosetting resin, etc.) that is uniformly transfer-molded directly over lens stacks 514 and the top surface of wafer 600. As substrate 700 is molded over the top surface of wafer 600, the adjacent spaces between lens stacks 514 become filled in with substrate 700. As substrate 700 is molded over lens stacks 514, an array of plungers (not shown) of a transfer molding machine contact the top surfaces of each lens stack 514 to form optical apertures 510. After housing substrate 700 is formed over lens stacks 514 and wafer 600, housing substrate 700 is cured (e.g., cooled). Then, housing substrate 700 and wafer 600 are diced along lines 702 to yield individual packages 800 (shown in FIG. 8). After packages 800 are formed, they are cleaned and prepared to be temporarily mounted on a carrier plate 802 (also shown in FIG. 8).

Figure 8:
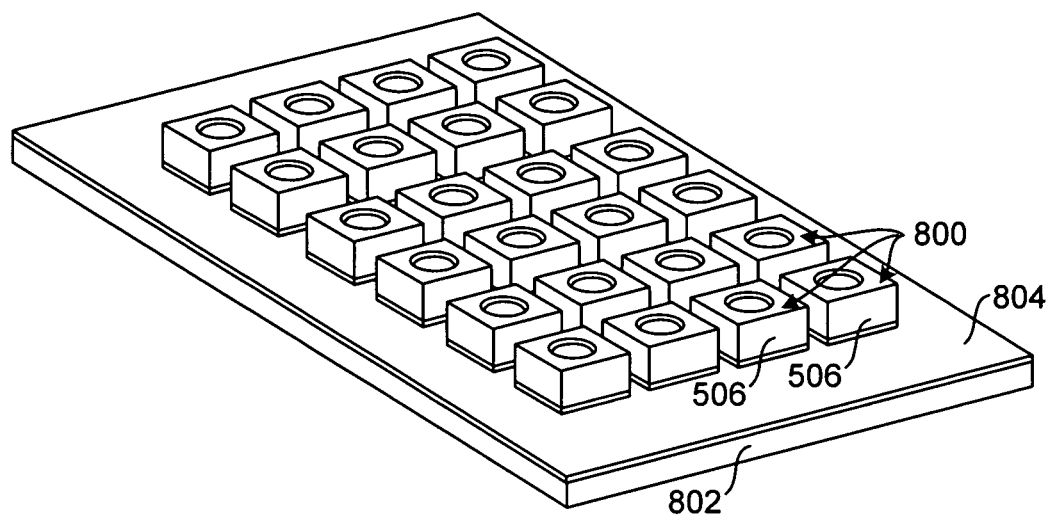
FIG. 8 is a perspective view of an array of individual packages, including the camera module of FIG. 5, mounted on a rigid carrier plate to form a manufacturing work piece.

FIG. 8 is a perspective view of an array of individual packages 800 temporarily mounted on a rigid carrier plate 802. At this point in the manufacturing process, outer layer 508 is not yet formed and, therefore, the outer most layer of packages 800 is actually inner layer 506. In this particular embodiment, individual packages 800 are individually positioned on carrier plate 802 using pick-and-place technology, which is well known to those skilled in the art. Packages 800 are positioned with respect to one another such that there is an even space between adjacent individual packages 800. Individual packages 800 are held in a fixed position on carrier plate 802 via an adhesive substrate (e.g., tape) 804 in preparation of forming respective outer layers 508 of housing 502 on each individual package 800.

Figure 9:
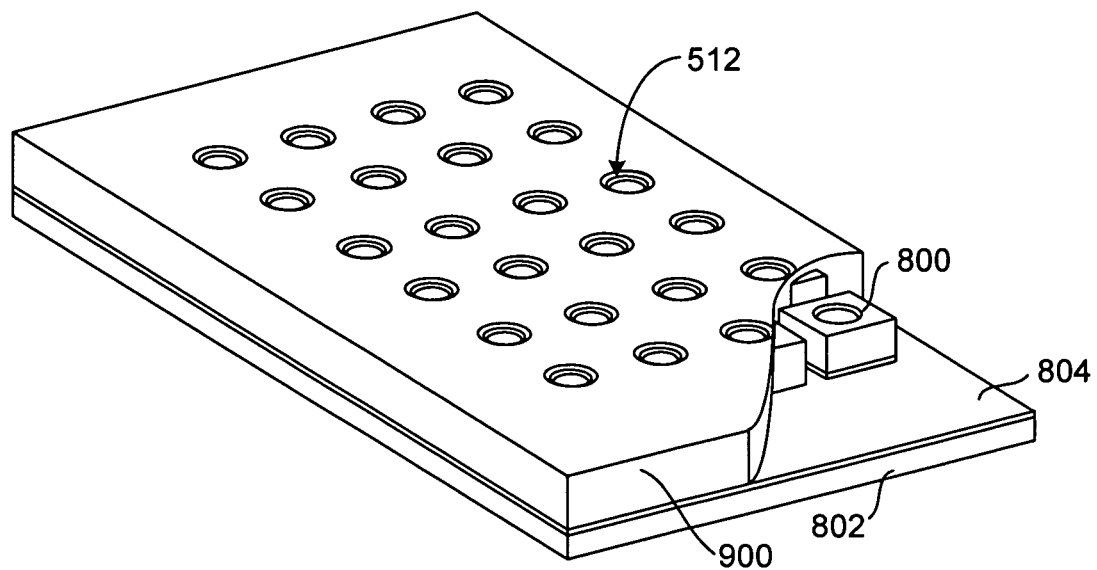
FIG. 9 is a perspective view of a second housing substrate formed over the individual packages of FIG. 8.

FIG. 9 shows a perspective view of a second housing substrate 900 formed directly over packages 800 and adhesive substrate 804. In this particular embodiment, housing substrate 900 is an opaque material (e.g., moldable plastic, thermosetting resin, etc.) that is uniformly transfer-molded directly over packages 800 and the top surface of adhesive substrate 804 so as to form an outer layer 508 over each one of respective packages 800. As substrate 900 is molded over the top surface of adhesive substrate 804, the adjacent spaces between packages 800 become filled in with substrate 900, thus covering the diced side edge surfaces of each one of image capture devices 516. By covering the side edge surfaces of each image capture device 516 with substrate 900, stray light is even more effectively prevented from entering package 800. As substrate 900 is molded over packages 800, an array of optical apertures 512 are coaxially formed over respective optical apertures 510, using a similar technique as described above. After housing substrate 900 is formed over packages 800, housing substrate 900 is cured (e.g., cooled) until rigid. Then, substrate 900 is removed from carrier plate 802 and adhesive substrate 804 is removed from substrate 900 in preparation for subsequent processes.

Figure 10:
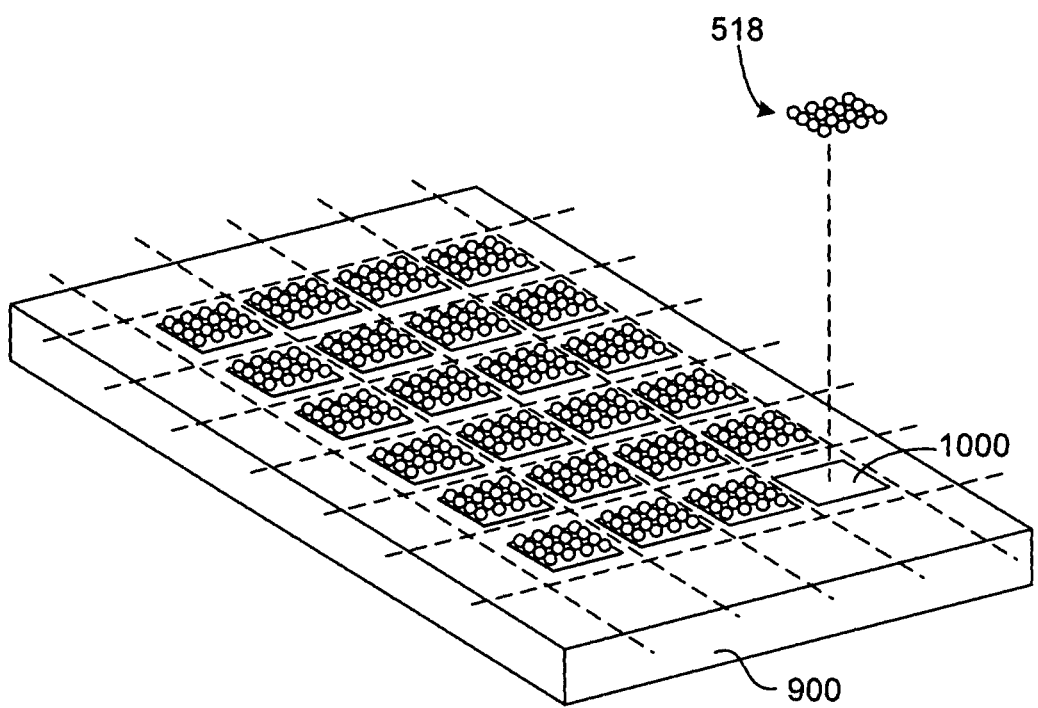
FIG. 10 is a rear perspective view of the housing substrate of FIG. 9.

FIG. 10 shows a rear perspective view of substrate 900 formed over packages 800. At this point in the manufacturing process, adhesive substrate 804 has been removed from housing substrate 900 to expose rear surfaces 1002 of each one of respective image capture devices 516. Each of rear surfaces 1002 includes a respective set of electrical contacts (not shown) formed thereon. These electrical contacts are in electrical communication with the circuitry formed in the top layer ICD 516 by, for example, through silicon vias.

After the removal of adhesive substrate 804, substrate 900 remains in one solid piece and positioned face-down while individual sets of solder balls 518 are mounted to the respective sets of electrical contacts. Once solder balls 518 are mounted over respective electrical contacts, solder balls 518 are reflowed onto the respective sets of electrical contacts. After solder balls 518 are reflowed, substrate 900 is diced (e.g., sawed) along lines 904 to form individual outer layers 508 over each respective package 800. Of course, once the dicing of substrate 900 is completed, multiple individual camera modules 500 are formed.

Figure 11:
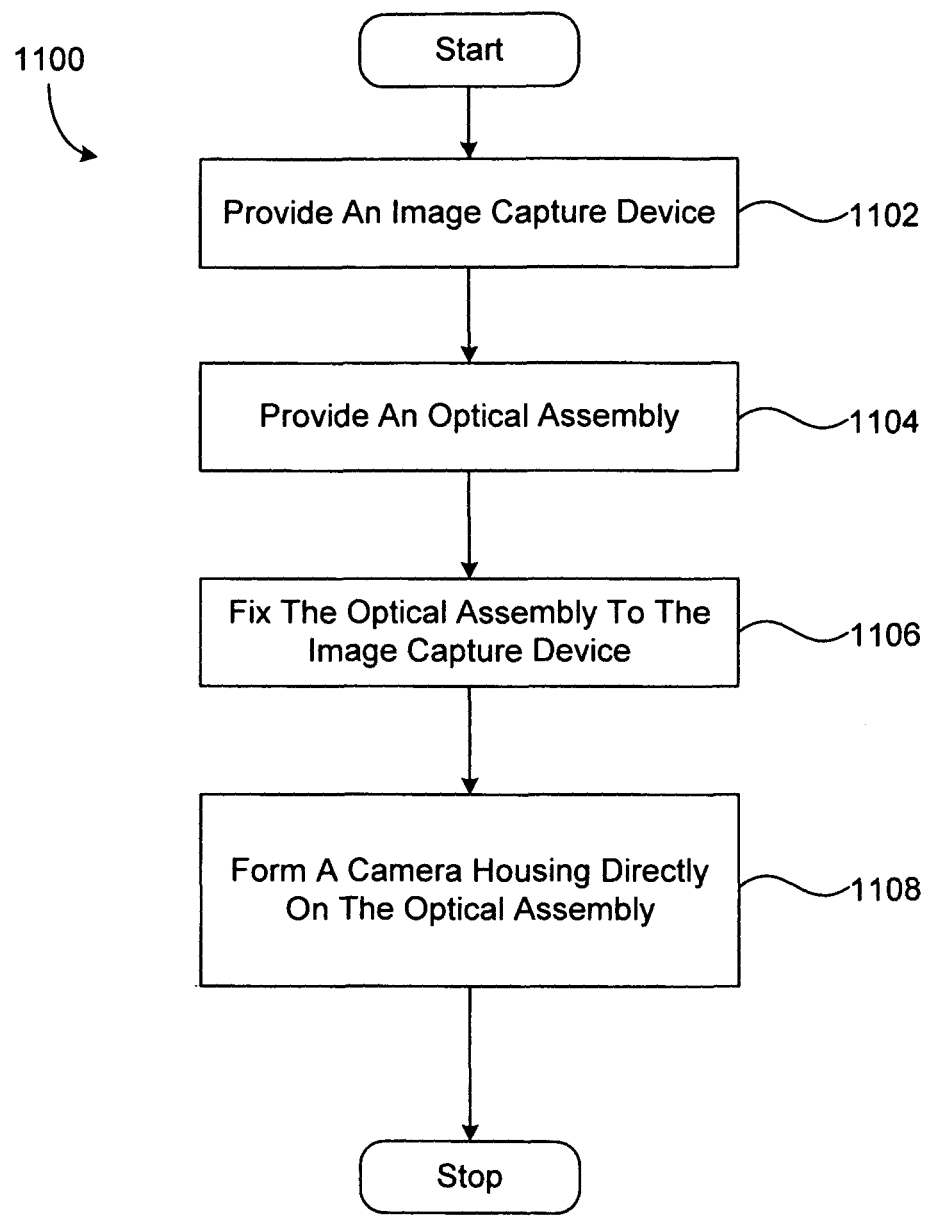
FIG. 11 is a flow chart summarizing a method for manufacturing a camera module.

FIG. 11 is a flow chart summarizing one method 1100 of manufacturing a camera module according to the present invention. In a first step 1102, an image capture device is provided. Next, in a second step 1104, an optical assembly is provided. Then, in a third step 1106, the optical assembly is fixed to the image capture device. Finally, in a fourth step 1108, a camera housing is formed directly on the optical assembly.

Figure 12:
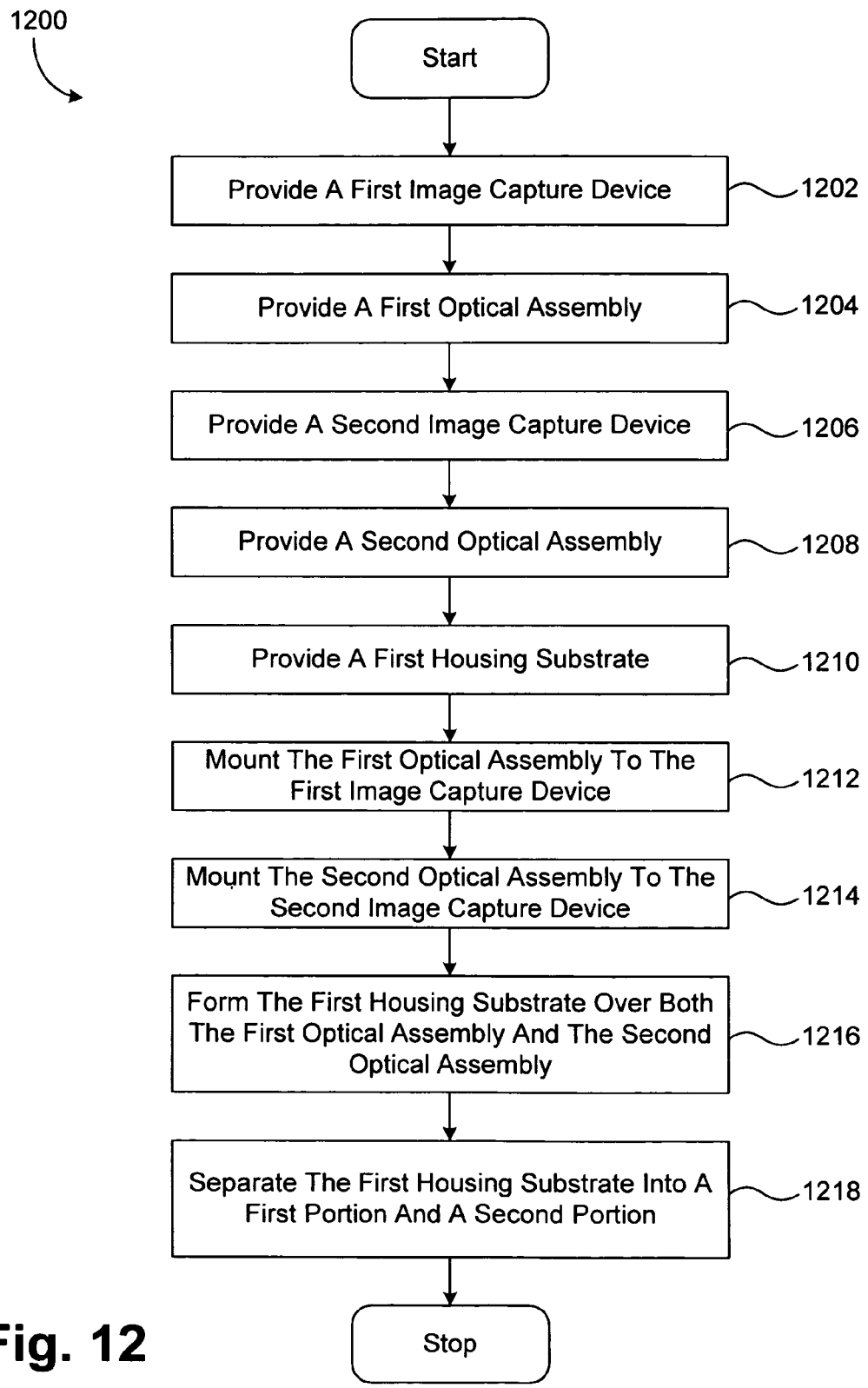
FIG. 12 is a flow chart summarizing a method for manufacturing a plurality of camera modules.

FIG. 12 is a flow chart summarizing an example method 1200 of manufacturing camera modules according to the present invention. In a first step 1202, a first image capture device is provided. Next, in a second step 1204, a first optical assembly is provided. Then, in a third step 1206, a second image capture device is provided. Next, in a fourth step 1208, a second optical assembly is provided. Then, in a fifth step 1210, a first housing substrate material is provided. Next, in a sixth step 1212, the first optical assembly is mounted to the first image capture device. Then, in a seventh step 1214, the second optical assembly is mounted to the second image capture device. Next, in an eighth step 1216, the first housing substrate is formed over both the first optical assembly and the second optical assembly. Finally, in a ninth step 1218, the first housing substrate is separated into a first portion and a second portion.

The description of particular embodiments of the present invention is now complete. Many of the described features may be substituted, altered or omitted without departing from the scope of the invention. For example, different numbers of lens elements may be used to form the optical stacks mounted on the ICDs. As another example, an IR filter can be integrated in the optical glass used to form the optical stacks, thereby reducing the number of components and assembly steps needed to complete the module. These and other deviations from the particular embodiments shown will be apparent to those skilled in the art, particularly in view of the foregoing disclosure.

We claim:

1. A method for manufacturing a camera module, said method including:
   providing an integrated circuit die having a top surface including an image sensor array for capturing an image, a bottom surface opposite said top surface, and a sidewall between said top surface and said bottom surface, said bottom surface having a peripheral portion;
   mounting a transparent substrate directly on and in contact with the image sensor array;
   providing an optical assembly;
   mounting said optical assembly directly to said top surface of said integrated circuit die; and;
   molding a unitary housing over said optical assembly and said integrated circuit die after said optical assembly is mounted to said integrated circuit die, said unitary housing contacting said sidewall and said peripheral portion of said bottom surface of said integrated circuit die, said molding including molding the unitary housing in direct contact with and covering at least a portion of a top of the optical assembly to define a light aperture above the optical assembly for light to pass through the aperture into the optical assembly and onto the image sensor.

2. A method for manufacturing a camera module according to claim 1, wherein said step of providing an integrated circuit die includes providing a set of contacts operable to facilitate the reflow soldering of said camera module to a circuit board of a camera module hosting device.

3. A method for manufacturing a camera module according to claim 2, said method further including forming solder balls on said contacts.

4. A method for manufacturing a camera module according to claim 1, wherein said step of mounting said transparent substrate over said integrated circuit die includes mounting a lens directly over said sensor array.

5. A method for manufacturing a camera module according to claim 1, wherein said step of mounting said optical assembly over said integrated circuit die includes providing a lens assembly and mounting said lens assembly on said transparent substrate.

6. A method for manufacturing a camera module according to claim 5, wherein said step of molding said unitary housing over said optical assembly includes molding said unitary housing directly over said lens assembly and said transparent substrate.

7. A method for manufacturing a camera module according to claim 6, wherein said step of mounting said optical assembly further includes mounting said optical assembly in a focused position before said step of molding said unitary housing on said optical assembly.

8. The method of claim 1, wherein the aperture is circular.

9. A method for manufacturing camera modules, said method including:
   providing a first image capture device;
   providing a first optical assembly;
   providing a second image capture device;
   providing a second optical assembly;
   mounting said first optical assembly on said first image capture device;
   mounting said second optical assembly on said second image capture device;
   forming a unitary first housing substrate over said first optical assembly, said first image capture device, said second image capture device, and said second optical assembly after said first optical assembly is mounted to said first image capture device and said second optical assembly is mounted to said second image capture device, said first housing substrate defining a first optical aperture above each of said first optical assembly and said second optical assembly;
   separating said first housing substrate into a first portion and a second portion after said first housing substrate is formed, said first portion of said first housing substrate forming an inner housing over said first optical assembly and said first image capture device, and said second portion of said first housing substrate forming an inner housing over said second optical assembly and said second image capture device; and
   forming a unitary second housing substrate over said first portion of said first housing substrate, said first image capture device, said second portion of said first housing substrate, and said second image capture device, said second housing substrate defining a second optical aperture above said first optical aperture above each of said first optical assembly and said second optical assembly.

10. A method for manufacturing camera modules according to claim 9, said method further including forming a first set of solder balls on said first image capture device and forming a second set of solder balls on said second image capture device after said second housing substrate is formed over said first portion of said first housing substrate, said first image capture device, said second portion of said first housing substrate, and said second image capture device.

11. A method for manufacturing camera modules according to claim 10, said method further including separating said second housing substrate into a first portion and a second portion after said first set of solder balls are formed on said first image capture device and said second set of solder balls are formed on said second image capture device, said first portion of said second housing substrate being formed over said first portion of said first housing substrate and said second portion of said second housing substrate being formed over said second portion of said first housing substrate.

12. A method for manufacturing camera modules according to claim 9, said method further including forming a first set of solder balls on said first image capture device and forming a second set of solder balls on said second image capture device before said step of separating said first housing substrate.

13. A method for manufacturing camera modules according to claim 9, wherein said step of providing a first image capture device and said step of providing said second image capture device include providing a unitary integrated circuit substrate, said first image capture device and second image capture device being formed on said unitary integrated circuit substrate.

14. A method for manufacturing camera modules according to claim 13, said method further including separating said first image capture device from said second image capture device after said first housing substrate is formed over said first optical assembly and said second optical assembly.

15. A method for manufacturing camera modules according to claim 14, wherein said step of separating said first housing substrate further includes separating said first image capture device from said second image capture device.

16. A method for manufacturing camera modules according to claim 14, wherein said step of forming said second housing substrate includes molding said second housing substrate into a single body formed over said first portion of said first housing substrate, said first image capture device, said second portion of said first housing substrate, and said second image capture device.

17. A method for manufacturing camera modules according to claim 16, said method further including forming a first set of solder balls on said first image capture device and forming a second set of solder balls on said second image capture device after said second housing substrate is formed over said first portion of said first housing substrate, said first image capture device, said second portion of said first housing substrate, and said second image capture device.

18. A method for manufacturing camera modules according to claim 17, said method further including separating said second housing substrate into a first portion and a second portion after said first set of solder balls is formed on said first image capture device and said second set of solder balls is formed on said second image capture device, said first portion of said second housing substrate being formed over said first portion of said first housing substrate and said second portion of said second housing substrate being formed over said second portion of said first housing substrate.

19. A method for manufacturing camera modules according to claim 9, wherein:

said steps of providing said first image capture device and said second image capture device include providing an integrated circuit substrate having a plurality of discrete image capture devices formed thereon;

said steps of providing said first optical assembly and said second optical assembly include providing a plurality of pre-focused optical stack assemblies;

said steps of mounting said first optical assembly to said first image capture device and mounting said second optical assembly to said second image capture device include mounting each of said plurality of pre-focused optical stack assemblies to a respective one of said plurality of image capture devices; and said step of forming said first housing substrate over said first optical assembly and said second optical assembly includes forming said first housing substrate over said plurality of focused optical assemblies after said step of mounting said plurality of optical assemblies to said plurality of image capture devices; and said step of separating said first housing substrate includes separating said first housing substrate into a plurality of respective discrete inner housing portions each formed over a respective one of said plurality of pre-focused optical stack assemblies.

20. A method for manufacturing camera modules according to claim 19, wherein said step of forming said second housing substrate includes forming said second housing substrate over said plurality of inner housing portions and said plurality of said image capture devices.

21. A method for manufacturing camera modules according to claim 20, said method further including forming a set of solder balls on each of said plurality of image capture devices.

22. A method for manufacturing camera modules according to claim 21, said method further including separating said second housing substrate into a plurality of discrete camera modules after said step of forming said set of solder balls on each of said plurality of image capture devices.

23. A method for manufacturing camera modules according to claim 9, wherein said step of forming said first housing substrate over said first optical assembly and said second optical assembly includes molding said first housing substrate into a single body directly over said first optical assembly and said second optical assembly.

24. A method for manufacturing camera modules according to claim 9, wherein said step providing a first image capture device includes providing a first integrated circuit die having a top surface including a sensor array for capturing an image and a bottom surface, said bottom surface of said first integrated circuit die having a plurality of contacts that facilitate an electrical connection between said first integrated circuit die and a host device circuit board, and said step providing a second image capture device includes providing a second integrated circuit die having a top surface including a sensor array for capturing an image and a bottom surface, said bottom surface of said second integrated circuit die having a plurality of contacts that facilitate an electrical connection between said second integrated circuit die and a host device circuit board.

25. The method of claim 9, wherein the first and second apertures are circular.

* * * * *